(12) United States Patent
Marzaki (10) Patent No.: US 10,109,601 B2
(45) Date of Patent: Oct. 23, 2018

(54) INTEGRATED CIRCUIT WITH DETECTION OF THINNING VIA THE BACK FACE AND DECOUPLING CAPACITORS

(71) Applicant: STMicroelectronics (Rousset) SAS, Rousset (FR)

(72) Inventor: Abderrezak Marzaki, Aix en Provence (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 0 days.

(21) Appl. No.: 15/698,882

(22) Filed: Sep. 8, 2017

(65) Prior Publication Data

US 2018/0247901 A1 Aug. 30, 2018

(30) Foreign Application Priority Data

Feb. 28, 2017 (FR) ...................... 17 51595

(51) Int. Cl.
*B24B 37/013* (2012.01)
*H01L 23/00* (2006.01)
*H01L 29/06* (2006.01)

(52) U.S. Cl.
CPC ........ *H01L 23/573* (2013.01); *H01L 29/0649* (2013.01)

(58) Field of Classification Search
CPC ....... H01L 23/562; H01L 23/02; H01L 23/28; B24B 37/013; B24B 37/005; B24B 37/0053
See application file for complete search history.

(56) References Cited

U.S. PATENT DOCUMENTS

| | | | |
|---|---|---|---|
| 9,754,901 B1* | 9/2017 | Peer | H01L 23/573 |
| 2015/0206809 A1* | 7/2015 | Ding | H01L 22/26 438/11 |
| 2016/0307855 A1* | 10/2016 | Charbonnier | H01L 23/576 |
| 2017/0243652 A1* | 8/2017 | Fornara | G11C 16/22 |

FOREIGN PATENT DOCUMENTS

| | | | |
|---|---|---|---|
| EP | 2535933 A1 | 12/2012 | |
| FR | 3012237 A1 | 4/2015 | |
| WO | WO-2017186887 A1 | 11/2017 | |

OTHER PUBLICATIONS

INPI Search Report and Written Opinion for FR 1751595 dated Nov. 24, 2017 (7 pages).

* cited by examiner

*Primary Examiner* — Jae Lee
(74) *Attorney, Agent, or Firm* — Crowe & Dunlevy (57) ABSTRACT

A semiconductor substrate has a back face and a front face and includes a semiconductor well that is electrically isolated from the semiconductor substrate. A device is configured to detect a thinning of the semiconductor substrate from the back face. The device includes at least one trench that extends within the semiconductor well between two peripheral locations from the front face down to a location situated at a distance from a bottom of the semiconductor well. The trench is electrically isolated from the semiconductor well. A detection circuit is configured to measure a physical quantity representative of well electrical resistance between two contact areas respectively situated on either side of the at least one first trench.

32 Claims, 6 Drawing Sheets

INTEGRATED CIRCUIT WITH DETECTION OF THINNING VIA THE BACK FACE AND DECOUPLING CAPACITORS

PRIORITY CLAIM

This application claims the priority benefit of French Application for Patent No. 1751595, filed on Feb. 28, 2017, the disclosure of which is hereby incorporated by reference in its entirety to the maximum extent allowable by law.

TECHNICAL FIELD

Various embodiments relate to integrated circuits and, more particularly, the detection of a potential thinning of the substrate of an integrated circuit from its back face.

BACKGROUND

Integrated circuits, in particular those equipped with memories containing sensitive information, need to be protected as far as possible against attacks, in particular attacks that are designed to discover stored data.

One possible attack may be carried out by a focused beam of ions (FIB for Focus Ion Beam), for example by means of a laser beam.

The effectiveness of such an attack increases when the substrate of the integrated circuit is thinned by the attacker, from its back face, in such a manner as to come as close as possible to the components of the integrated circuit, formed on its front face.

SUMMARY

According to one embodiment and its implementation, a detection of a potential thinning of the substrate of an integrated circuit from its back face is accordingly provided, which detection is simple to implement and particularly compact in terms of surface area occupied.

Furthermore, integrated circuits may also be equipped with decoupling capacitors between the supply voltage and ground, more commonly known by those skilled in the art under the term "filler cap".

According to one embodiment, the idea is to use, at least in part, the thinning detection device to form the decoupling capacitors.

According to one aspect, an integrated circuit is provided comprising a semiconductor substrate having a back face and a front face and including an assembly of at least one semiconductor well electrically isolated from the rest of the substrate (the assembly may potentially comprise several semiconductor wells).

The integrated circuit further comprises a device for detecting a thinning of the substrate via its back face, this device comprising a group of at least one first trench (the group being able to potentially comprise several first trenches) extending within the at least one well between two locations on its periphery and from the front face of the substrate down to a location situated at a distance from the bottom of the at least one well.

The at least one first trench is electrically isolated from the well.

The detection device comprises a detection circuit configured for measuring a physical quantity representative of the electrical resistance of the well between two contact areas respectively situated on either side of the group of at least one first trench.

Thus, according to this aspect, the at least one trench is directly formed within the semiconductor well, typically an active region, which is simple to implement and advantageous from the point of view of surface area occupied.

The trench extends at a distance from the bottom of the well. Consequently, if the substrate is thinned until the well is thinned, the electrical resistance of the latter will increase, which will allow this thinning to be detected.

The physical quantity representative of this resistance may be the resistance itself, or else a current or a voltage.

Although it is possible to use this detection device in a semiconductor well of the N type of conductivity disposed in a semiconductor substrate of the P type, it is particularly advantageous to form the first trench or trenches within a well of the P type of conductivity, electrically isolated from the rest of the substrate by a structure of the triple-well type. Indeed, the surface area occupied by such a well of the P type is smaller with respect to that of a well of the N type notably as far as its lateral isolation is concerned.

Thus, according to one embodiment, the substrate and the at least one well are of the P type of conductivity and the at least one well is electrically isolated from the substrate by an isolation region comprising a peripheral isolation trench, for example a trench of the Shallow Trench Isolation (STI) type extending into the substrate from the front face and surrounding the at least one well.

The isolation region further comprises a semiconductor layer of the N type of conductivity buried in the substrate under the at least one well (this buried layer being commonly denoted by those skilled in the art under the acronym "NISO" for N type isolation region).

The isolation region further comprises an intermediate peripheral insulating region surrounding the at least one well and configured for ensuring a continuity of electrical isolation between the buried semiconductor layer and the peripheral isolation trench.

The at least one first trench then extends between at least two locations on the peripheral isolation trench.

According to a first possible variant, the isolation region comprises an additional peripheral trench having at least one insulating envelope, extending from the front face through the peripheral isolation trench (for example of the shallow trench isolation type) and having a lower part extending under this peripheral isolation trench until it makes contact with the buried semiconductor layer.

According to another possible variant, this additional peripheral trench having at least one insulating envelope extends from the front face through the peripheral isolation trench and has a lower part extending under this peripheral isolation trench at a distance from the buried semiconductor layer and an implanted region of the N type of conductivity situated between the lower part and the buried semiconductor layer.

In other words, in this variant, the additional peripheral trench does not come into contact with the buried isolation layer and the isolation of the well is then formed by this implanted region of the N type of conductivity.

The at least one first trench may then extend between two locations of the additional peripheral trench.

This additional peripheral trench may be totally insulating.

The same may apply to the at least one first trench.

By way of example, the detection circuit may comprise a biasing circuit configured for applying a potential difference between the two contact areas, together with a measurement circuit configured for measuring the current flowing between the two contact areas.

Instead of the additional peripheral trench and the at least one first trench being totally insulating, they may each comprise an electrically conducting central region, for example made of polysilicon, surrounded by an insulating envelope, for example made of silicon dioxide.

In this case, these trenches may also be used to form decoupling capacitors.

For this purpose, according to one embodiment, the group may comprise several parallel first trenches connecting two opposing edges of the additional peripheral trench.

The detection circuit may then comprise a first biasing circuit configured for applying a first potential difference between the two contact areas and a measurement circuit configured for measuring the current flowing between the two contact areas, and the integrated circuit may comprise a second biasing circuit configured for applying a second potential difference between the central region of the additional peripheral trench and the at least one semiconductor well (which allows the decoupling capacitors to be formed between the supply voltage and ground).

The structures are also advantageously compatible with the fabrication, within the integrated circuit, of a memory device comprising a memory plane having non-volatile memory cells and selection transistors with buried gate, since the at least one first trench may have a depth substantially equal to that of the buried gates.

When the integrated circuit comprises several wells, the device may further comprise a coupling circuit configured for electrically coupling in series two adjacent wells so as to form a chain of wells electrically coupled in series, the coupling circuit being disposed between the two groups of at least one first trench respectively extending into the two adjacent wells.

The two contact areas are then respectively situated on either side of the two groups of at least one first trench respectively extending into the two wells respectively situated at the two ends of the chain.

The detection circuit is then configured for measuring a physical quantity representative of the electrical resistance of the chain of wells between the two contact areas.

Such a structure of concatenated wells may also be used as such, in other words not necessarily in combination with a device for detecting a thinning of substrate, in such a manner as to create, within the integrated circuit, a resistive circuit or path having a high value of resistance while at the same time occupying a reduced volume, which is particularly advantageous in analog applications.

Thus, according to another aspect, an integrated circuit is provided, comprising a semiconductor substrate having a back face and a front face and including: an assembly of several (at least two) semiconductor wells electrically isolated from the rest of the substrate, a group of at least a first trench extending into each well between two locations on its periphery and from the front face down to a location situated at a distance from the bottom of the well, the at least one first trench being electrically isolated from the well, a coupling circuit configured for electrically coupling in series two adjacent wells so as to form a chain of wells electrically coupled in series, the coupling circuit being disposed between the two groups of at least one first trench, respectively extending into the two adjacent wells, and two contact areas respectively situated on either side of the two groups of at least one first trench, respectively extending into the two wells respectively situated at the two ends of the chain, in such a manner as to form a resistive circuit extending between the two contact areas.

According to another aspect, a physical object is provided, for example a smartcard or an electronic apparatus, such as for example a cellular mobile telephone or a tablet, comprising an integrated circuit such as defined hereinbefore.

According to another aspect, a method is provided for detecting a thinning of the semiconductor substrate of an integrated circuit from its back face, the substrate including an assembly of at least one semiconductor well electrically isolated from the rest of the substrate and comprising a group of at least one first trench extending within the at least one well between two locations on its periphery and from the front face of the substrate down to a location situated at a distance from the bottom of the at least one well, the at least one first trench being electrically isolated from the well, the method comprising: measuring a physical quantity representative of the electrical resistance of the well between two contact areas respectively situated on either side of the group of at least one first trench.

BRIEF DESCRIPTION OF THE DRAWINGS

Other advantages and features will become apparent upon examining the detailed description of non-limiting embodiments and their implementation, and from the appended drawings in which.

DETAILED DESCRIPTION

Figure 1:
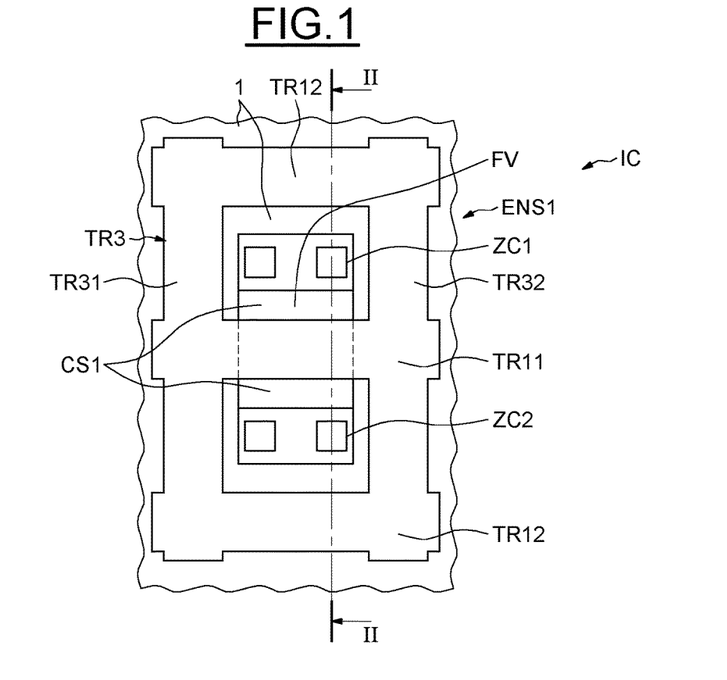
FIGS. 1 and 2 present a top view and cross section view of an integrated circuit.
Figure 2:
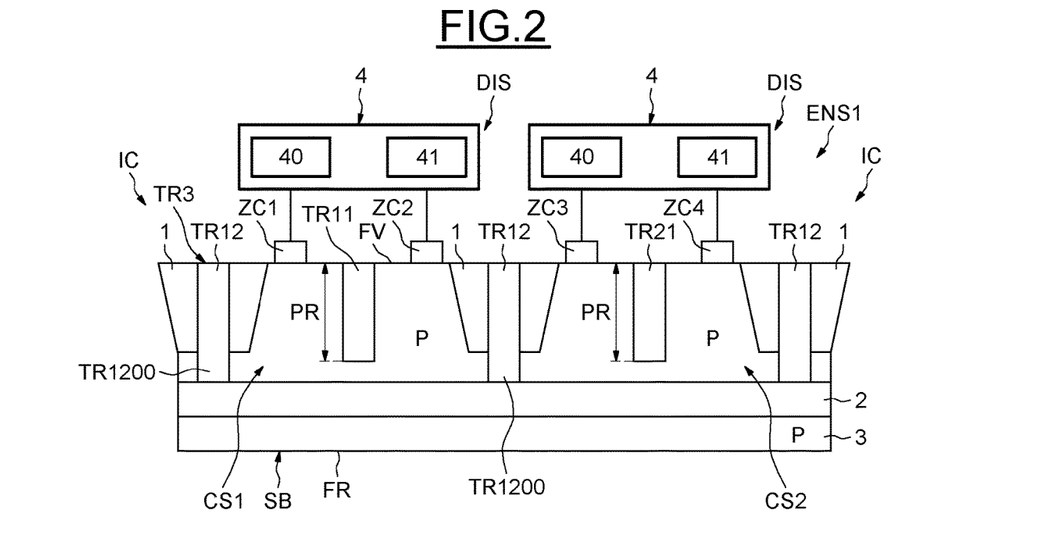

In FIG. 1 and in FIG. 2, the reference IC denotes an integrated circuit notably comprising an assembly ENS1 of semiconductor wells, here of the P type of conductivity, formed within a semiconductor substrate SB also of the P type of conductivity.

In the example described here, the assembly ENS1 comprises two semiconductor wells CS1 and CS2. For the purposes of simplifying the figures, only the well CS1 is shown in FIG. 1 and, accordingly, the left-hand part of FIG. 2 is a cross-sectional view along the line II-II in FIG. 1.

As will now be seen, each well CS1, CS2 is electrically isolated from the lower part 3 of the substrate SB by an isolation region comprising a certain number of elements.

More particularly, if, for the sake of simplification, reference is only made to the well CS1, it can be seen that the isolation region comprises a peripheral isolation trench 1, for example of the shallow trench isolation (or STI) type surrounding the well CS1 and extending into the substrate from the front face FV or upper face.

The isolation region also comprises a semiconductor layer 2, buried in the substrate, under the well CS1 and, furthermore, also under the well CS2, and of the N type of conductivity.

The isolation region also comprises an intermediate peripheral insulating region surrounding the well CS1 and configured for ensuring a continuity of electrical isolation between the buried semiconductor layer 2 and the peripheral isolation trench 1.

In the example illustrated in FIG. 1 and in FIG. 2, the isolation region comprises an additional peripheral trench TR3 extending from the front face FV through the peripheral isolation trench 1 and having a lower part TR1200 extending under this peripheral isolation trench 1 until it makes contact with the buried semiconductor layer.

Here, this lower part TR1200 forms the intermediate peripheral insulating region which provides the continuity of electrical isolation between the buried semiconductor layer 2 and the peripheral insulating trench 1.

As can be seen in these FIGS. 1 and 2, the additional peripheral trench TR3, which surrounds the well CS1, here has a rectangular shape and comprises two parallel first branches TR12 here forming the small sides of the rectangle and two other parallel branches TR31 and TR32 forming the two large sides of the rectangle.

In the example illustrated in these FIGS. 1 and 2, this additional peripheral trench TR3 is fully insulating and comprises for example silicon dioxide.

The integrated circuit IC also comprises a device DIS for detecting a thinning of the substrate SB via its back face FR.

The device DIS here comprises a first trench TR11 extending into the well CS1 between two locations of the additional peripheral trench TR3 and, more particularly, between the two opposing edges TR31 and TR32 of this additional peripheral trench.

The first trench TR11 extends from the front face FV down to a location situated at a distance from the bottom of the well CS1, in other words here at a distance from the buried semiconductor layer 2.

The depth of this first trench TR11 is denoted as PR.

This first trench is electrically isolated from the well.

For this purpose, in the embodiment illustrated in FIGS. 1 and 2, the first trench TR11 is totally insulating and comprises for example silicon dioxide.

A further first trench TR21, with a structure analogous to the first trench TR11, is formed in the other semiconductor well CS2 whose lateral isolation region comprises another additional peripheral trench TR3.

The device DIS also comprises a detection circuit 4 configured for measuring a physical quantity representative of the electrical resistance of the well CS1 between two contact areas ZC1, ZC2 respectively situated on either side of the first trench TR11.

By analogy, the device DIS also comprises a further detection circuit 4 configured for measuring a physical quantity representative of the electrical resistance of the well CS2 between two contact areas ZC3 and ZC4 respectively situated on either side of the corresponding first trench TR21.

Indeed, the measurement of this physical quantity representative of the electrical resistance of a well allows the thinning of the substrate SB from its back face to be detected.

The reason for this being that the more the substrate SB is thinned into the corresponding well CSi, the more the electrical resistance of this well CSi will increase until it becomes virtually infinite when the thinning has reached the lower end of the corresponding first trench TR11 (TR21).

For this purpose, by way of non-limiting example, the detection circuit 4 may comprise a biasing circuit 40 configured for applying a potential difference between the two contact areas ZC1, ZC2, for example a supply voltage VDD on the contact ZC1 and ground on the contact ZC2, and a measurement circuit 41 configured for measuring the current flowing between the two contact areas.

A comparison circuit may also be provided designed to compare the measured value of the current with a reference value corresponding to the value of the current in the absence of a thinning of the well.

As a variant, it would also be possible for the detection circuit to comprise a comparator whose non-inverting input would be connected to a voltage divider and whose inverting input would be connected to one of the contacts ZC1 or ZC2. The comparator then compares the voltage present on the contact with the reference voltage supplied by the voltage divider and delivers a signal whose value is representative of the fact that the voltage present on the contact is lower or otherwise than the reference voltage.

Moreover, this voltage is indeed a quantity representative of the current flowing in the resistive path formed by the two contact areas ZC1 and ZC2 and the well C1, and notably the resistance of this well CS1.

Figure 3:
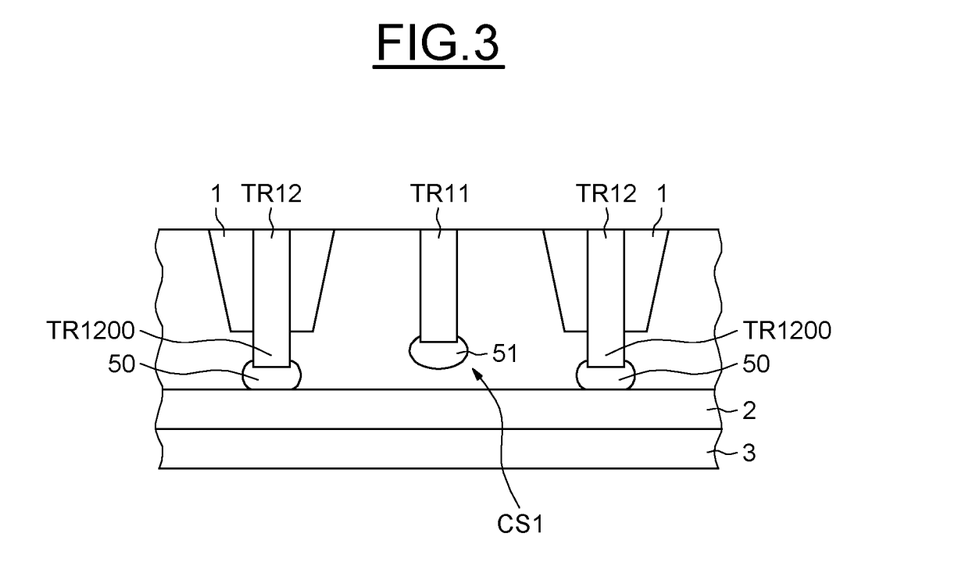
FIG. 3 illustrates a variant of an intermediate peripheral insulating region surrounding a well.

FIG. 3 illustrates one variant of the intermediate peripheral insulating region surrounding the well CS1 and configured for ensuring a continuity of electrical isolation between the buried semiconductor layer 2 and the peripheral insulating layer 1.

In this embodiment, the lower part TR1200 of the additional peripheral trench TR3 does not come into contact with the buried semiconductor region 2. Furthermore, the intermediate peripheral insulating region then comprises this lower part TR1200 together with an implanted region 50 of the N type of conductivity (and hence of a type of conductivity identical to the type of conductivity of the layer 2) situated between the lower part TR1200 and the buried semiconductor layer 2.

It should be noted that the first trench TR11 is also extended by an implanted region of the N type of conductivity, referenced 51, which allows the depth to be increased and allows it to come even closer to the buried semiconductor layer 2.

Figure 4:
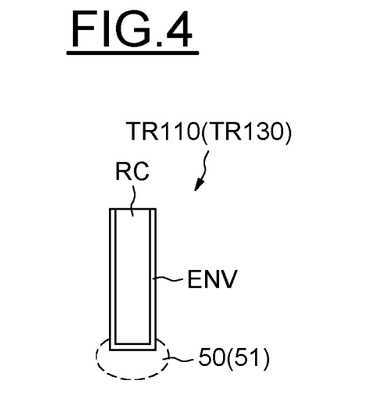
FIG. 4 shows a trench completed by an implanted region.

Whereas each first trench and each additional peripheral trench are totally insulating as disclosed above, it is possible, as illustrated in FIG. 4, for each first trench (referenced TR110 in FIG. 4) and each additional peripheral trench (referenced TR130 in FIG. 4) to each comprise an electrically conducting central region RC, for example made of polysilicon, surrounded by an insulating envelope ENV, for example made of silicon dioxide.

In addition, as illustrated in FIG. 4, such a trench TR110 (TR130) may advantageously be completed by an implanted region of the N type of conductivity 50(51).

The use of trenches comprising an electrically conducting central region surrounded by an insulating envelope ENV allows these trenches to be used to form decoupling capacitors as will be explained in more detail hereinbelow.

As has just been seen, the bottom of the first trench TR11 may be at a distance from the buried semiconductor layer 3.

Figure 5:
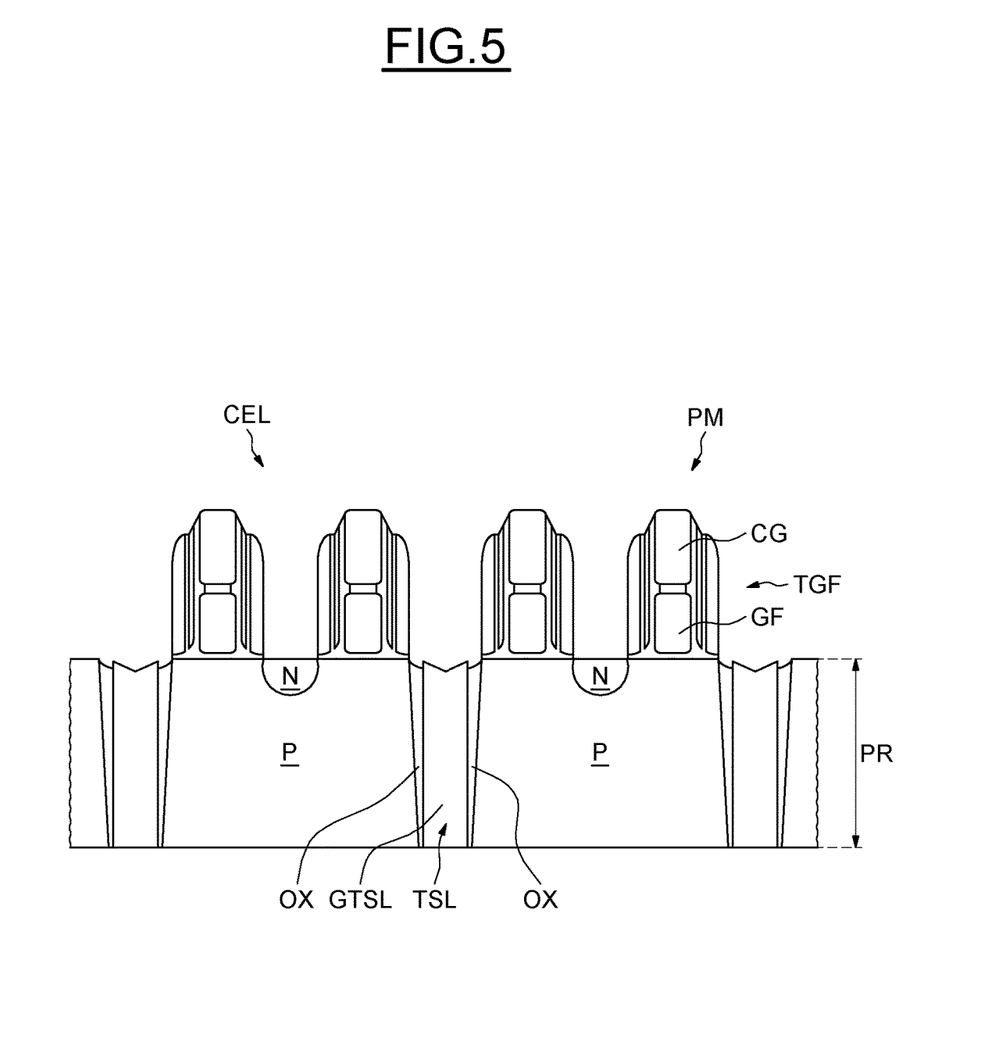
FIG. 5 shows a cross section of a memory circuit.

This is compatible with a method for fabrication of a memory device (formed in another location of the integrated circuit) whose memory plane PM has, as illustrated schematically in FIG. 5, non-volatile memory cells CEL and selection transistors with buried gate TSL.

More precisely, each cell-memory CEL comprises a floating gate transistor TGF formed in and on a semiconductor well of the P type separated from the underlying substrate of the P type by a semiconductor layer of the N type (not shown here for the sake of simplification).

Conventionally, each floating gate transistor comprises a floating gate GF, for example made of polysilicon, and a control gate CG.

Each selection transistor TSL allows a row of cells to be selected and is a MOS transistor whose gate GTSL is a gate buried in the well of the P type and electrically isolated from this well by a gate oxide OX, typically of silicon dioxide.

The buried gate GTSL is common to the two adjacent selection transistors TSL whose two gate oxides OX are respectively situated on the two flanks of this buried gate.

Also, as illustrated in FIG. 5, the depth PR of the trenches having allowed the formation of the buried selection gates GTSL is then advantageously identical or substantially identical to the depth PR of each first trench TR11.

Figure 6:
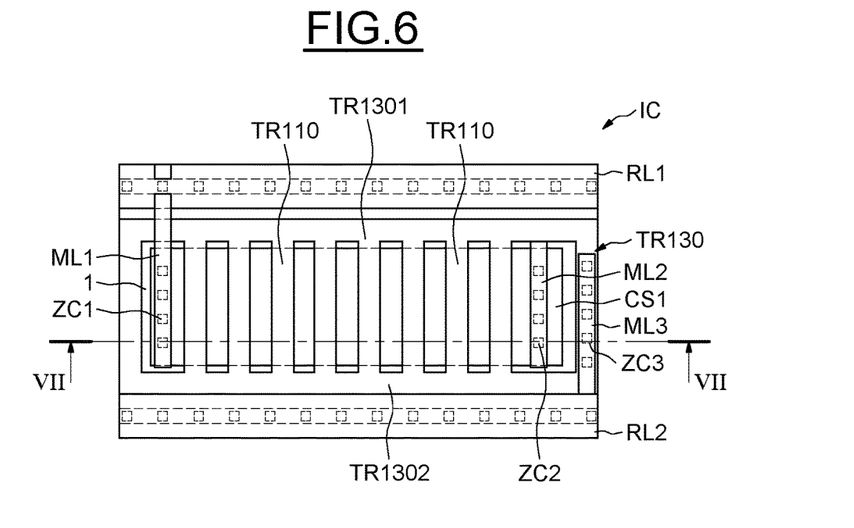
FIGS. 6 to 8 show a trench structure allowing a detection of a thinning of the substrate via the back face and a formation of decoupling capacitors.
Figure 7:
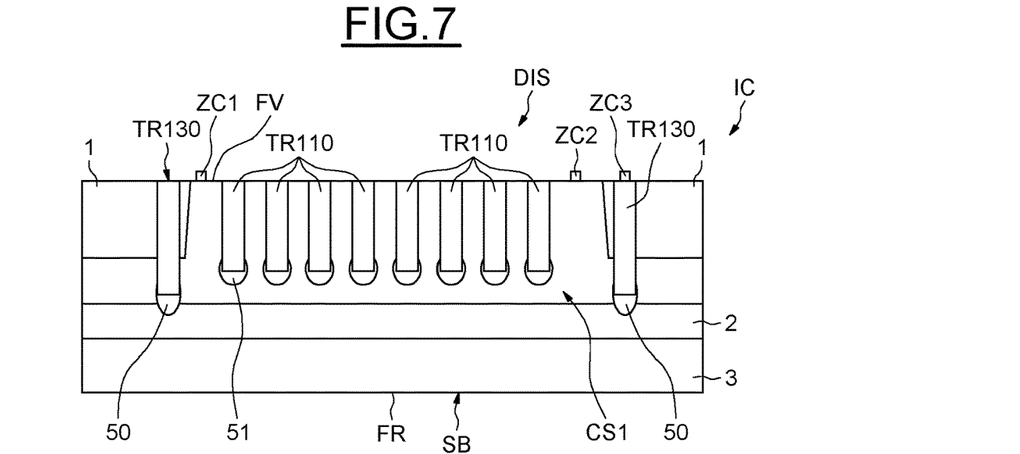
Figure 8:
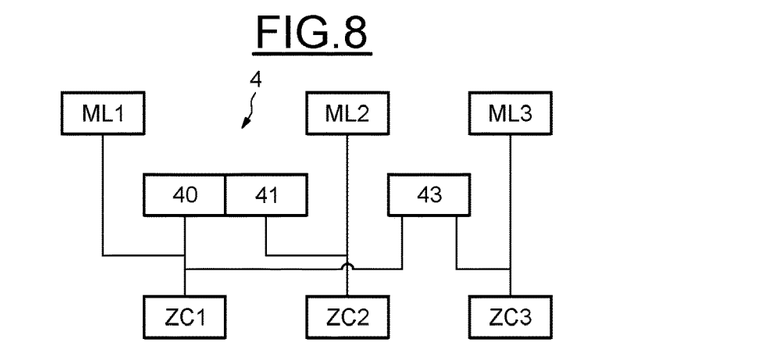

Reference is now more particularly made to FIGS. 6 to 8 in order to describe a trench structure allowing a detection of a thinning of the substrate via the back face and a formation of decoupling capacitors between the supply voltage VDD and ground GND to be combined.

For this purpose, as illustrated in FIG. 4, all the trenches comprise an electrically conducting central region, for example made of polysilicon, surrounded by an insulating envelope ENV playing the role of a capacitor dielectric spacer.

Furthermore, in the example illustrated in FIG. 7, which is a cross-sectional view along the line VII-VII in FIG. 6, the trenches are extended on their lower part by implanted regions of the N type of conductivity 50 or 51.

In this example, the additional peripheral trench TR 130 is again of rectangular shape and the device DIS for detecting a thinning of the substrate via the back face FR here comprises, within the well CS1, a group of several first trenches TR110 all parallel and extending between the two large opposing edges TR1301 and TR1302 of the additional peripheral trench TR130.

A first contact area ZC1 is disposed in contact with the well CS1 and a second contact area ZC2 is disposed in contact with the well CS1 on the other side of the group of first trenches TR110.

Furthermore, a third contact area ZC3 is disposed in contact with the additional peripheral trench TR130.

For this purpose, the integrated circuit IC comprises a first supply rail RL1 intended to carry the supply voltage VDD and a second supply rail RL2 intended to be connected to ground GND.

The contacts ZC1 are connected to the rails RL1 by vias (not shown here) and a metallization ML1.

Similarly, the contacts ZC3 are connected to the rails RL2 by vias and another metallization ML3.

Lastly, the contacts ZC2 are connected by vias to another metallization ML2. Also, as can be seen in FIG. 8, the detection circuit 4 comprises a first biasing circuit 40 configured for applying, via the metallizations ML1 and ML2, a first potential difference between the two contact areas ZC1 and ZC2, together with a measurement circuit 41 configured for measuring, for example, the current flowing between these two contact areas ZC1 and ZC2.

Furthermore, a second biasing circuit 43 is configured for applying, via the metallizations ML1 and ML3, a second potential difference (typically the difference VDD-GND) between the central region of the additional peripheral trench TR130 and the semiconductor well CS1, which allows decoupling capacitors to be formed between the supply voltage and ground.

Figure 9:
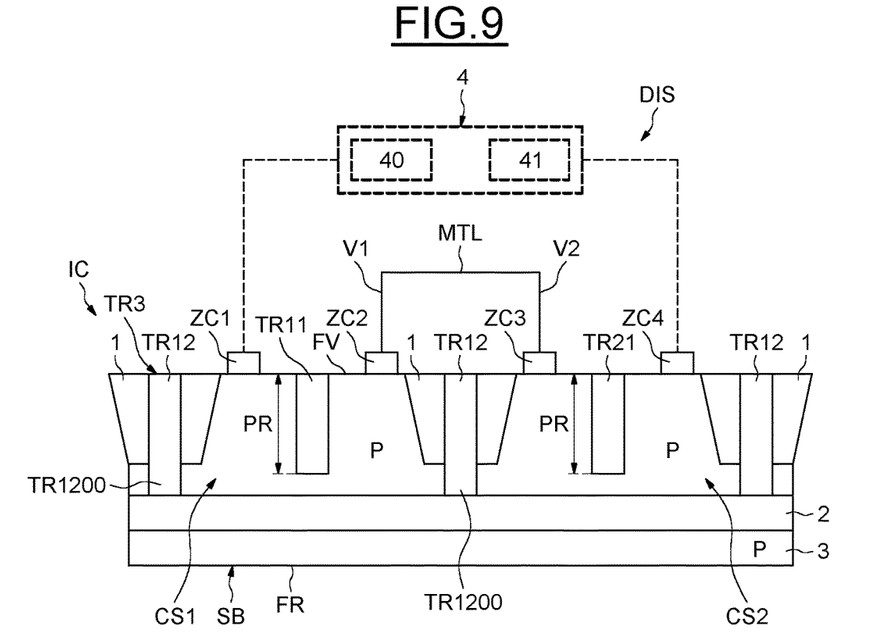
FIG. 9 shows electrically coupling several wells in series.

As can be seen in FIG. 9, it is possible to electrically couple in series several wells (here only two wells are shown) each equipped with at least one first trench TR11, TR21, so as to form a chain of wells electrically coupled in series.

In FIG. 9, the wells CS1 and CS2 are of the type of those illustrated in FIG. 2, in other words wells of the P type of conductivity electrically isolated from the rest 3 of the substrate by the insulating region 1, TR1200, 2.

As a variant, the wells could also be wells of the N type within a substrate P. In FIG. 9, the coupling circuit allows the electrical coupling between two adjacent wells CS1 and CS2 comprise a metallization MTL and vias V1 and V2 connecting the two contact areas ZC2 and ZC3.

Of course, the wells could be of the type comprising groups of several first trenches.

The device DIS then comprises a detection circuit 4, for example of the type of those previously described, configured for measuring a physical quantity representative of the electrical resistance between the two contact areas ZC1, ZC4 respectively situated on either side of the two first trenches TR11 and TR21 extending within the wells disposed at the two ends of the chain of wells.

Figure 10:
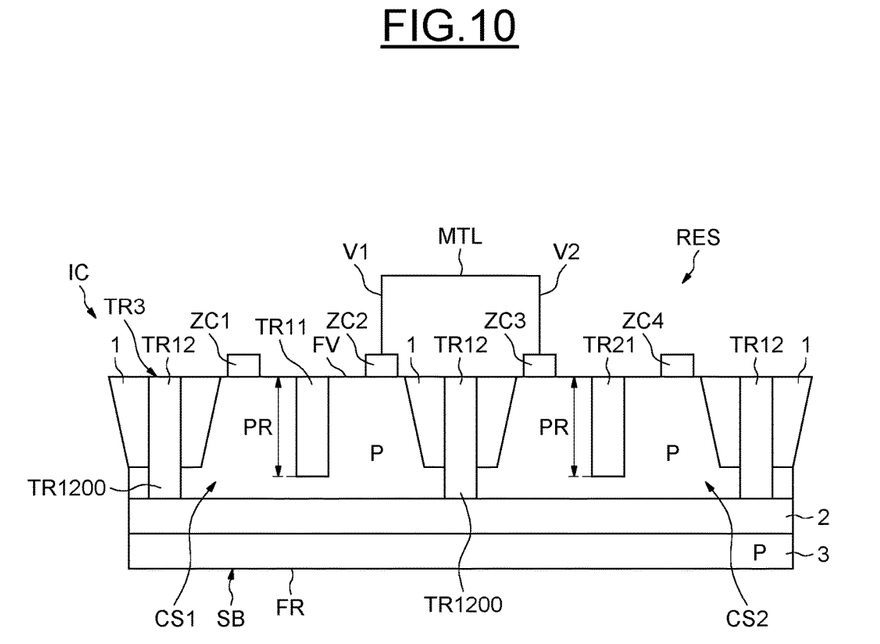
FIG. 10 shows a chain of wells electrically coupled in series in order to form a resistive circuit within the integrated circuit.

As can be seen in FIG. 10, it is also possible to use this structure of chain of wells electrically coupled in series in order to form, within the integrated circuit IC, a resistive circuit RES having a large resistive value while at the same time having a reduced size.

This is particularly advantageous for analog applications.

The integrated circuit IC may comprise such a resistive circuit RES without necessarily comprising any device DIS for detecting a thinning of the substrate via the back face.

However, if the integrated circuit comprises both such a resistive circuit RES and a device DIS for detecting a thinning of the substrate via the back face, the circuit RES and the device DIS may be disposed at different locations of the integrated circuit.

In FIG. 10, the wells CS1 and CS2 are as in FIG. 9, of the type of those illustrated in FIG. 2, in other words wells of the P type of conductivity electrically isolated from the rest 3 of the substrate by the insulating region 1, TR1200, 2.

However, the wells could also be wells of the N type within a P substrate.

The coupling circuit allows the electrical coupling between the two adjacent wells CS1 and CS2 here comprise a metallization MTL and vias V1 and V2 connecting the two contact areas ZC2 and ZC3.

Thus, the resistive circuit RES notably extends in the chain of wells, here the two wells CS1 and CS2, between the two contact areas ZC1 and ZC4 which are situated on the wells localized at the two ends of the chain of wells CS1, CS2 on either side of the two first trenches TR11 and TR21 extending within these end wells.

The wells could of course be of the type of that illustrated in FIGS. 6 and 7, in other words comprising groups of several first trenches.

Figure 11:
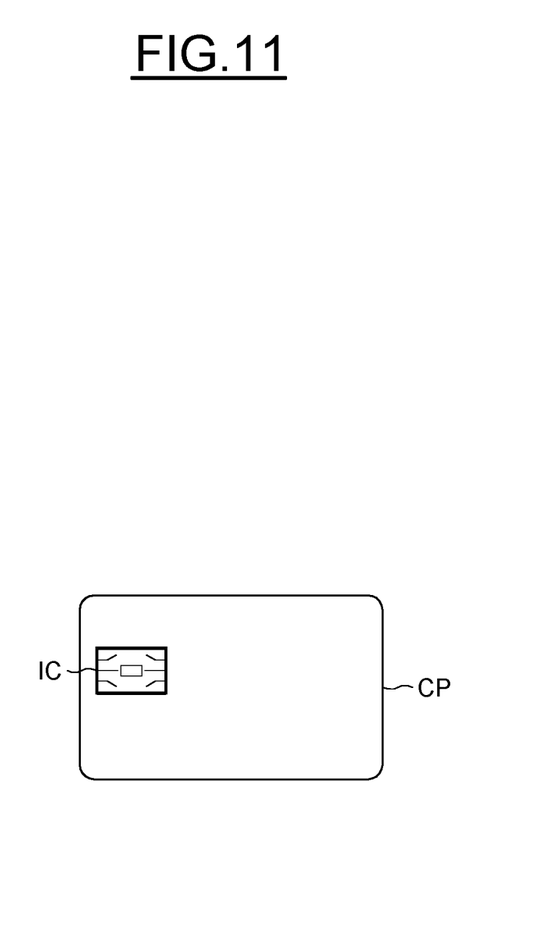
FIG. 11 schematically shows a smartcard implementation.

Such an integrated circuit IC may be incorporated into any object, notably a smartcard CP, such as illustrated very schematically in FIG. 11.

The invention claimed is:

1. A method for detecting a thinning of a semiconductor substrate of an integrated circuit from a back face of the semiconductor substrate, wherein the semiconductor substrate includes an assembly of at least one semiconductor well electrically isolated from the semiconductor substrate and comprising a group of at least one first trench extending within the at least one semiconductor well between two locations on a periphery of the at least one semiconductor well and from a front face of the semiconductor substrate down to a location situated at a distance from the bottom of the at least one semiconductor well, the at least one first trench being electrically isolated from the at least one semiconductor well, the method comprising: measuring a physical quantity representative of an electrical resistance of the at least one semiconductor well between two contact areas respectively situated on either side of the group of at least one first trench.

2. An integrated circuit, comprising:
a semiconductor substrate having a back face and a front face and including an assembly of at least one semiconductor well electrically isolated from the semiconductor substrate; and
a device configured to detect a thinning of the semiconductor substrate from the back face, comprising:
a group of at least one first trench extending within the at least one semiconductor well between two locations on a periphery of the at least one semiconductor well and from the front face down to a location situated at a distance from a bottom of the at least one semiconductor well, the at least one first trench being electrically isolated from the at least one semiconductor well; and
a detection circuit configured to measure a physical quantity representative of an electrical resistance of the at least one semiconductor well between two contact areas respectively situated on either side of the group of at least one first trench.

3. The integrated circuit according to claim 2, wherein the detection circuit comprises a biasing circuit configured to apply a potential difference between the two contact areas and a measurement circuit configured to measure a current flowing between the two contact areas.

4. The integrated circuit according to claim 2, wherein the at least one first trench is totally insulating.

5. The integrated circuit according to claim 2, wherein the group comprises several first trenches.

6. The integrated circuit according to claim 2, wherein the at least one semiconductor well comprises several semiconductor wells.

7. The integrated circuit according to claim 6, further comprising a coupling circuit configured for electrically coupling in series two semiconductor wells of said several semiconductor wells so as to form a chain of semiconductor wells electrically coupled in series, the coupling circuit being disposed between two groups of at least one first trench respectively extending into the two semiconductor wells, and wherein the two contact areas are respectively situated on either side of the two groups of at least one first trench respectively extending into the two semiconductor wells respectively situated at two ends of the chain, the detection circuit configured to measures a physical quantity representative of the electrical resistance of the chain of semiconductor wells between the two contact areas.

8. The integrated circuit according to claim 2, wherein the integrated circuit is a part of an object.

9. The integrated circuit according to claim 8, wherein the object is a smartcard.

10. The integrated circuit according to claim 2, wherein the semiconductor substrate and the at least one semiconductor well are of a P type of conductivity, and wherein the at least one semiconductor well is electrically isolated from the semiconductor substrate by an isolation region comprising:
a peripheral isolation trench extending into the semiconductor substrate from the front face and surrounding the at least one semiconductor well,
a semiconductor layer of the N type of conductivity buried in the semiconductor substrate under the at least one semiconductor well, and
an intermediate peripheral insulating region surrounding the at least one semiconductor well and configured to ensure a continuity of electrical isolation between the buried semiconductor layer and the peripheral isolation trench, and
wherein the at least one first trench extends at least between two locations of the peripheral isolation trench.

11. The integrated circuit according to claim 10, wherein the isolation region comprises an additional peripheral trench having at least one insulating envelope, extending from the front face through the peripheral isolation trench and having a lower part extending under this peripheral isolation trench to makes contact with the buried semiconductor layer.

12. The integrated circuit according to claim 11, wherein the at least one first trench extends between two locations of the additional peripheral trench.

13. The integrated circuit according to claim 11, in which the additional peripheral trench is totally insulating.

14. The integrated circuit according to claim 10, wherein the isolation region comprises an additional peripheral trench having at least one insulating envelope, extending from the front face through the peripheral isolation trench and having a lower part extending under this peripheral isolation trench at a distance from the buried semiconductor layer, and an implanted region of the N type of conductivity situated between a lower part and the buried semiconductor layer.

15. The integrated circuit according to claim 14, wherein the at least one first trench extends between two locations of the additional peripheral trench.

16. The integrated circuit according to claim 14, wherein the additional peripheral trench is totally insulating.

17. An integrated circuit, comprising:
a semiconductor substrate having a back face and a front face and including an assembly of several semiconductor wells electrically isolated from the semiconductor substrate;
a group of at least one first trench extending within each semiconductor well between two locations on a periphery of the semiconductor well and from the front face down to a location situated at a distance from a bottom of the semiconductor well, the at least one first trench being electrically isolated from the semiconductor well;
a coupling circuit configured to electrically couple two semiconductor wells of the assembly of several semiconductor wells in series so as to form a chain of semiconductor wells electrically coupled in series, the coupling circuit being disposed between two groups of at least one first trench respectively extending within the two semiconductor wells; and
two contact areas respectively situated on either side of the two groups of at least one first trench respectively extending into the two semiconductor wells respectively situated at two ends of the chain, so as to form a resistive circuit extending between the two contact areas.

18. The integrated circuit according to claim 17, wherein the semiconductor substrate and the at least one semiconductor well are of a P type of conductivity, and wherein the at least one semiconductor well is electrically isolated from the semiconductor substrate by an isolation region comprising:
- a peripheral isolation trench extending into the semiconductor substrate from the front face and surrounding the at least one semiconductor well,
- a semiconductor layer of the N type of conductivity buried in the semiconductor substrate under the at least one semiconductor well, and
- an intermediate peripheral insulating region surrounding the at least one semiconductor well and configured to ensure a continuity of electrical isolation between the buried semiconductor layer and the peripheral isolation trench, and
- wherein the at least one first trench extends at least between two locations of the peripheral isolation trench.

19. The integrated circuit according to claim 18, wherein the isolation region comprises an additional peripheral trench having at least one insulating envelope, extending from the front face through the peripheral isolation trench and having a lower part extending under this peripheral isolation trench to makes contact with the buried semiconductor layer.

20. The integrated circuit according to claim 19, wherein the at least one first trench extends between two locations of the additional peripheral trench.

21. The integrated circuit according to claim 19, in which the additional peripheral trench is totally insulating.

22. The integrated circuit according to claim 18, wherein the isolation region comprises an additional peripheral trench having at least one insulating envelope, extending from the front face through the peripheral isolation trench and having a lower part extending under this peripheral isolation trench at a distance from the buried semiconductor layer, and an implanted region of the N type of conductivity situated between a lower part and the buried semiconductor layer.

23. The integrated circuit according to claim 22, wherein the at least one first trench extends between two locations of the additional peripheral trench.

24. The integrated circuit according to claim 22, wherein the additional peripheral trench is totally insulating.

25. The integrated circuit according to claim 22, wherein the additional peripheral trench and the at least one first trench each comprise an electrically conducting central region surrounded by an insulating envelope.

26. The integrated circuit according to claim 25, wherein the group comprises several parallel first trenches connecting two opposing edges of the additional peripheral trench.

27. The integrated circuit according to claim 25, wherein the detection circuit comprise a first biasing circuit configured to apply a first potential difference between the two contact areas and a measurement circuit configured to measure a current flowing between the two contact areas, and a second biasing circuit configured to applying a second potential difference between the central region of the additional peripheral trench and the at least one semiconductor well.

28. The integrated circuit according to claim 17, further including a memory device comprising a memory plane having non-volatile memory cells and selection transistors with buried gates, the at least one first trench having a depth substantially equal to a depth of the buried gates.

29. The integrated circuit according to claim 17, wherein the integrated circuit is a part of an object.

30. The integrated circuit according to claim 29, wherein the object is a smartcard.

31. The integrated circuit according to claim 17, wherein the at least one first trench is totally insulating.

32. The integrated circuit according to claim 17, wherein the group comprises several first trenches.

* * * * *